Sept. 2, 1958 H. T. LYMAN ET AL 2,850,632

WIDE RANGE RADIO FREQUENCY TUNER

Filed June 21, 1954 2 Sheets-Sheet 1

Inventors
Harold T. Lyman
Francis G. Mason
By Olome, McDougall, Williams + Hersh
Atty's Inventors
Harold T. Lyman
Francis G. Mason
By Dome, McDougall, Williams + Hersh
Att'ys United States Patent Office 2,850,632

Patented Sept. 2, 1958

2,850,632

WIDE RANGE RADIO FREQUENCY TUNER

Harold T. Lyman, Milford, and Francis Gage Mason, Westport, Conn., assignors to Aladdin Industries, Incorporated, Nashville, Tenn., a corporation of Illinois Application June 21, 1954, Serial No. 438,044

6 Claims. (Cl. 250—40)

One principal object of the invention is to provide an improved radio frequency tuner adapted to tune over an extremely wide frequency range so as to cover, for example, the commercial television frequencies between 54 and 890 megacycles.

A further object is to provide a wide range radio frequency tuner of the foregoing character which will have an extremely high factor of merit, or "Q," at the upper end of the frequency range covered by the tuner.

It is another object of the invention to provide a tuner which provides a variable inductance coil at relatively low frequencies and a tunable cavity resonator at relatively high frequencies, the changeover from coil resonance to cavity resonance being effected smoothly and without band switching or any objectionable discontinuity in the turning curve.

A further object is to provide an improved wide range radio frequency tuner of the foregoing character in which a changeover is automatically made between low frequency and high frequency input and output circuits without switching.

Further objects and advantages of the invention will appear from the following description taken with the accompanying drawings, in which.

Figures 1, 2:
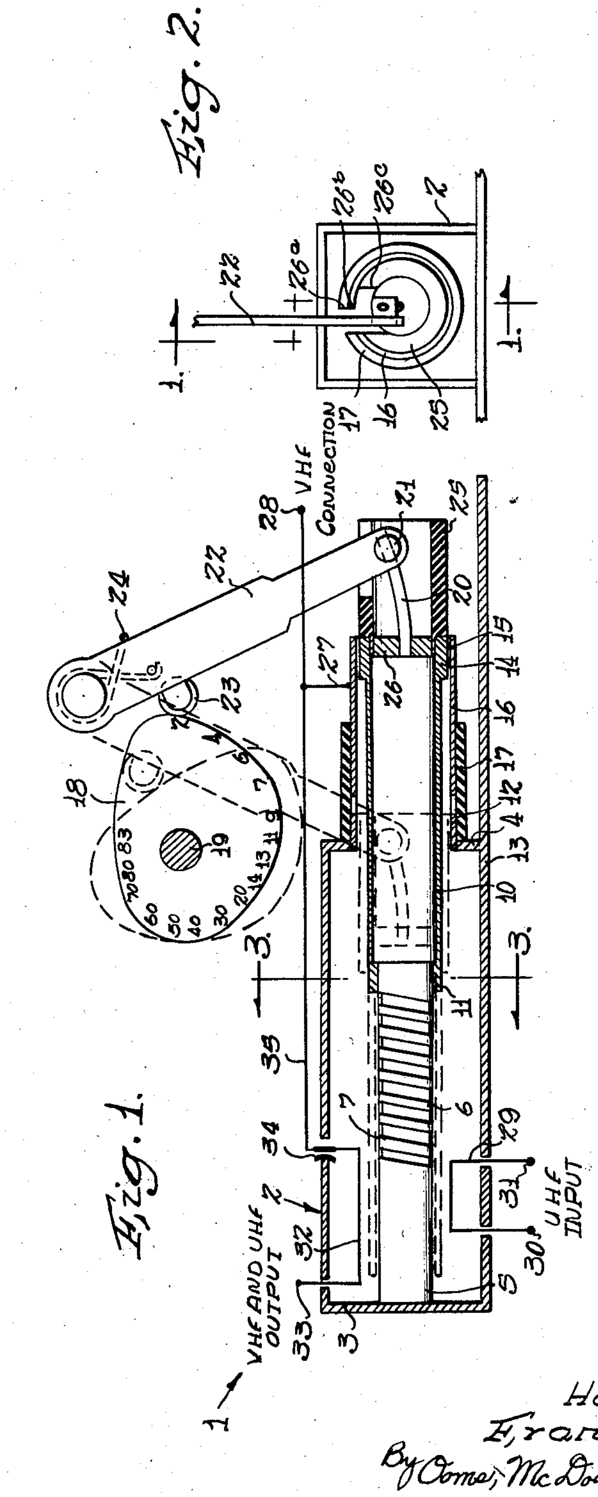
Figure 1 is a longitudinal sectional view of a purely illustrative radio frequency tuner embodying the invention, the view being taken generally along a line 1—1 in Fig. 2.
Fig. 2 is an end view of the tuner of Fig. 1.

Considered in greater detail, Fig. 1 illustrates a radio frequency tuner 1 which is adapted to cover an extremely wide frequency range, such as the range from 54 to 890 megacycles. This particular range embraces the V. H. F. (very high frequency) commercial television band from 54 to 216 megacycles and the U. H. F. (ultrahigh frequency) commercial television band from 470 to 890 megacycles.

Figure 3:
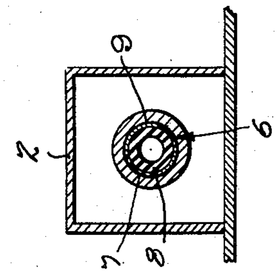
Fig. 3 is a transverse sectional view taken generally along a line 3—3 in Fig. 1.

To cover the upper portion of its frequency range, the tuner is provided with an elongated, conductive metallic housing 2 which acts as a re-entrant quarter wave cavity resonator at frequencies between 470 and 890 megacycles. The illustrated housing 2 is rectangular in cross section, as shown in Fig. 3, and is provided with opposite end walls 3 and 4.

A conductive post 5 is mounted axially within the resonator 2 in energy transfer relation with the end wall 3. In the specific tuner shown, the post 5 is actually in direct conductive engagement with the end wall 3.

Figure 4:
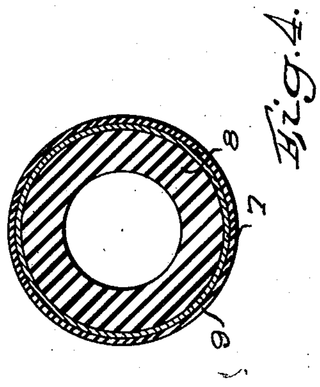
Fig. 4 is an enlarged cross-sectional view of a coil embodied in the tuner of Fig. 1.

In order to provide for resonance at relatively low frequencies, a coil 6 is disposed within the housing 2 in coaxial relation with the post 5. The illustrated coil 6 has one end portion 7 connected directly to the outer end of the post 5. Both the post 5 and the coil 6 may be composed of metal deposited or otherwise formed on an insulating tubular support 8 (Figs. 3 and 4). Printed circuit or related techniques may advantageously be employed in forming the coil 6, although the coil may also be formed by more conventional methods such as by winding metallic ribbon on the tubular form 8. A thin layer 9 of a low-loss dielectric material may be applied over the coil 6 and the post 5 to insulate and protect these elements, the layer being so thin as to be transparent.

The tuner 1 is tuned by means of an elongated energy transfer element 10 arranged so that relative movement may take place between the tuning element 10 and the housing 2. While the energy transfer element 10 may assume various forms, it is shown as an elongated sleeve adapted to be telescopically received over the coil 6 and the post 5, the sleeve thereby being adapted to envelop or surround these elements.

The illustrated sleeve 10 has a left hand end portion 11 which is narrowed down internally so as to have a fairly close sliding fit with the coil 6 and the post 5. While the sleeve 10 might in some cases be in direct conductive engagement with the coil 6 and the post 5, it is preferable to insulate these elements from the sleeve to afford capacitive energy interchange between the sleeve 10 on the one hand and the post 5 and the coil 6 on the other. In this instance, the insulating coating 9 provides the desired insulation, but it will be understood that the insulation might be applied to the inner surface of the sleeve or might be supplied by an air gap between the sleeve and the coil 6.

For one portion of the tuning range of the tuner, energy is transferred to and from the tuning sleeve 10 by means of an energy transfer element 12 interposed between the sleeve and the cavity resonator housing 2. In this instance, the transfer element 12 takes the form of a ring mounted in or around an axial aperture 13 formed in the end wall 4 of the housing 2. Thus, the ring 12 is in direct conductive engagement with the end wall 4.

The sleeve 10 has an extreme right hand end portion 14 which is enlarged to have a fairly close sliding fit with the ring 12. Insulation 15 is provided between the sleeve 10 and the ring 12. Preferably, the insulation takes the form of an insulating coating applied to the outside of the enlarged portion 14 of the sleeve 10. The insulation 15 provides for capacitive energy transfer between the ring 12 and the sleeve 10 when the sleeve is moved to the left to bring the enlarged end portion 14 into alinement with the ring 12. The ring 12 thus serves to couple the sleeve 10 to the cavity end wall 4 at the upper end of the tuning range of the tuner 1.

To provide for energy transfer to the sleeve 10 at relatively low frequencies, a second energy transfer element 16 is disposed adjacent the sleeve 10 and in spaced relation to the transfer ring 12. In this instance, the transfer element 16 takes the form of an elongated coupling ring or sleeve supported outside the housing 2, and in spaced axially alined relation to the ring 12 by means of an insulating tube 17 mounted on the ring 12. Throughout the right hand portion of the range of movement of the sleeve 10, the enlarged portion 14 of the sleeve moves within the coupling ring 16 and is thus capacitively coupled to the ring.

Provision is made for effecting relative movement between the tuning sleeve 10 and the resonator housing 2. In this instance, the sleeve 10 is adapted to be moved along the coil 6 and the post 5 by means of a cam 18 mounted on a rotatable control shaft 19. A flexible insulating rod 20 is employed to connect the sleeve 10 to a pivot 21 mounted on a cam follower arm 22 which carries a roller 23 adapted to follow the cam 18. A biasing spring 24 is connected to the arm so as to hold the roller 23 against the cam 18.

An insulating tube 25 may be mounted on the right hand end of the tuning sleeve 10 to slide within the elongated ring 16 and thereby guide the sleeve when it is adjacent the left hand end of its range of movement. The flexible rod 20 may be secured to a disk 26 mounted within the insulating guide tube 25. Alined longitudinal slots *26a*, *26b*, and *26c* may be formed in the supporting tube 17, the energy transfer ring 16, and the guide tube 26, respectively, to admit the arm 22 and permits its free movement between the positions shown in full- and dotted-lines in Fig. 1.

With the sleeve 10 and the arm 22 in the full-line position shown in Fig. 1, the enlarged portion 14 of the sleeve 10 is capacitively coupled to the energy transfer ring 16, and the internally reduced portion 11 of the sleeve is capacitively coupled to the right hand end of the coil 6. Accordingly, the entire coil 6 is effectively connected between the ring 16 and the housing 2. It will be understood that the coil is resonated by capacitances between the sleeve 10 and the coil 6 and between the sleeve 10 and the ring 16, in combination with the capacitance between the ring 16 and the housing 2, as well as other distributed and circuit capacitances.

Movement of the sleeve 10 to the left results in progressive envelopment of the coil 6 by the sleeve, and in corresponding reduction of the portion of the coil effectively connected between the ring 16 and the housing 2. The portion of the coil 6 enveloped in the sleeve 10 is effectively short-circuited, or at least heavily loaded, and is decoupled from the portion of the coil between the sleeve and the housing 2. In this way, the sleeve 10 largely prevents any adverse effects upon the performance of the tuner due to spurious resonances in the inactive portion of the coil 6. The resonant frequency of the tuner progressively increases as the sleeve 10 envelops the coil 6.

Continued movement of the sleeve 10 to the left eventually results in complete envelopment of the coil 6. With the coil thus rendered inactive, the housing 2 resonates as a re-entrant quarter wave cavity loaded by the effective capacitance between end walls 3 and 4, due to the interaction of the ring 12, the sleeve 10, and the post 5. Actually, the housing 2 begins to partake of the characteristics of a resonant cavity before the entire coil 6 is enveloped so that there is a smooth changeover from coil resonance to cavity resonance.

As the sleeve 10 approaches the point at which it completely envelops the coil 6, the enlarged portion 14 of the sleeve 10 passes from the coupling ring 16 to the coupling ring 12. When the sleeve 10 reaches the point at which it fully envelops the coil 6, the enlarged portion 14 has moved entirely within the ring 12. Further movement of the sleeve 10 to the left withdraws the enlarged portion 14 out of the ring 12 and thus decreases the capacitance between the ring and the sleeve 10. In this way, the capacitive loading between the walls 3 and 4 of the cavity 2 is decreased and the resonant frequency of the cavity is correspondingly increased. It will be understood that the capacitance between the ring 12 and the sleeve 10 is in series with the capacitance between the sleeve 10 and the post 5. Accordingly, the capacitive loading of the cavity decreases as the capacitance between the ring 12 and the sleeve 10 is decreased, even though the capacitance between the post 5 and the sleeve 10 may simultaneously be increased to a certain extent by progressive envelopment of the post 5. At the upper end of the frequency range covered by the tuner, the enlarged portion 14 of the sleeve 10 has been withdrawn entirely from the ring 12, and the sleeve 10 is entirely within the cavity resonator housing 2.

Various means may be employed for transferring energy to and from the tuner 1. At comparatively low frequencies, energy may be transferred to and from the tuner 1 by connecting a lead 27 to the energy transfer ring 16. It will be recalled that the sleeve 10 couples the ring 16 to the coil 6 for the portion of the frequency range in which the sleeve 10 is within the ring 16. As shown, the lead 27 is connected to a terminal 28 which, for example, may be employed as an input terminal for the V. H. F. television band.

At higher frequencies, such as in the U. H. F. television band, energy may be transferred to the tuner 1 by means of an input coupling loop 29 disposed within the resonator housing 2. The loop may be connected to U. H. F. input terminals 30 and 31. It will be understood that the size and location of the loop 29 may be varied so as to provide any desired impedance between the terminals 30 and 31, and also to vary the degree of coupling of the input circuit to the cavity resonator, thereby controlling the frequency band width of transferred energy.

Energy may be transferred from the tuner 1 at ultrahigh frequencies by means of an output coupling loop 32 disposed in the resonator housing 2. One end of the coupling loop 32 is shown connected to an output terminal 33. The other end of the output loop 32 is brought out of the housing 2 by means of a feed-through capacitor 34 and is connected to the ring 16 and the input terminal 28 by means of a lead 35. The feed-through capacitor 34 provides a small capacitance between the end of the coupling loop 32 and the housing 2 and, hence, might be replaced by any small capacitor connected between the lead 35 and the housing. At ultrahigh frequencies, the capacitor 34 has a low impedance and thus effectively grounds the end lead 35 of the coupling loop 32 to the resonator housing 2. At such frequencies the loop 32 is effective to transfer energy from the tuner 1.

In the lower end of the frequency range of the tuner 1, the input loop 29 and the output loop 32 are largely ineffective to transfer energy to and from the coil 6 or at least are inefficient means for transferring energy. At these lower frequencies, energy is carried by the lead 27 from the V. H. F. input terminal 28 to the ring 16 and thence is transferred to the sleeve 10 and the coil 6. Energy is carried from the ring 16 to the output terminal 33 by means of the lead 35 and the coupling loop 32, which acts merely as an extension of the lead 35. In the V. H. F. or low end of the frequency range, the capacitor 34 has a relatively high impedance and thus is ineffective to bypass the lead 35 to ground. The tuning action in the V. H. F. range is due to the parallel resonance of the inductance of the uncovered portion of the coil 6 and the post 5 with the capacitance provided by the capacitor 34 and the external circuit connected to the terminal 28.

For the higher frequency portion of the tuning range, the sleeve 10 is withdrawn from the coupling ring 16 with the result that the ring 16 is effectively disconnected from the tuner, in addition to being effectively grounded by the capacitor 34.

It will now be apparent that variation of the adjustment of the tuner 1 automatically effects a changeover from one set of input and output circuits to another set. This changeover is accomplished by frequency selection and by the effect of moving the sleeve 10 from the elongated ring 16 to the ring 12. In the lower end of the frequency range, input and output circuit connections are made to the ring 16. At higher frequencies, the ring 16 is automatically removed from the circuit and the coupling loops 29 and 32 are automatically made effective.

Figure 5:
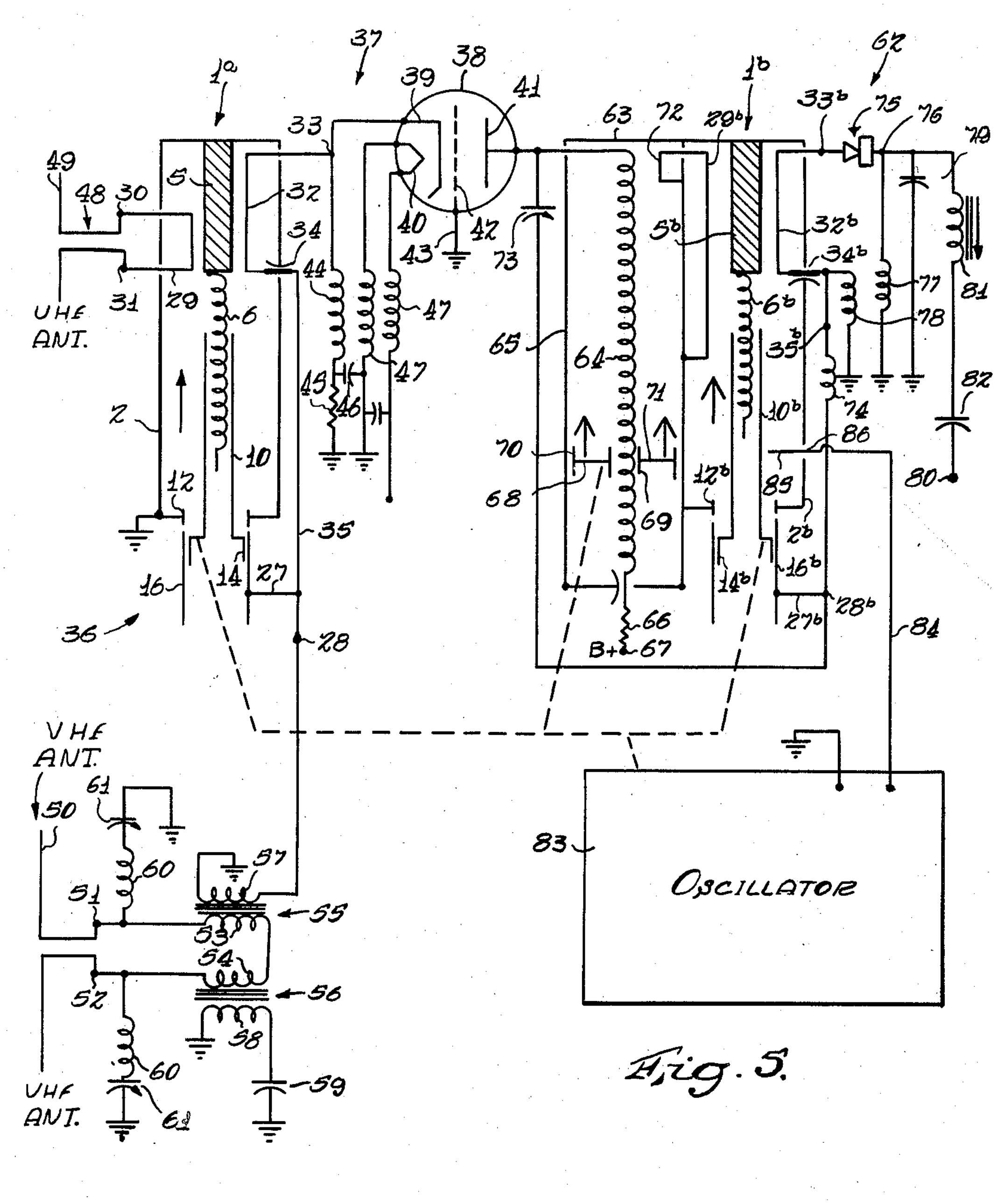
Fig. 5 is a schematic diagram of a superheterodyne converter unit utilizing two tuners of the general type shown in Fig. 1.

The tuner of Fig. 1 may be employed in various types of circuits for which tuning is desired. For example, Fig. 5 shows a superheterodyne converter unit 36 embodying two of the tuners which, for identification, have been designated *1a* and *1b* being identical to the tuner 1 and the tuner *1b* being slightly modified. The converter unit 36 comprises a radio frequency amplifier stage 37 utilizing a grounded grid type triode 38 having a cathode 39, a cathode heater 40, an anode 41, and a grid 42 which is connected to ground by a lead 43. The output terminal 33 of the tuner 1*a* is connected directly to the cathode 39. An aperiodic choke 44 and a resistor 45 are connected in series between the cathode 39 and ground, the resistor 45 being bypassed to ground by a capacitor 46. To prevent effective grounding of the cathode 39 by the heater 40, aperiodic chokes 47 are connected in series with the heater.

The input terminals 30 and 31 of the tuner 1*a* may be connected by means of a transmission line 48 to a U. H. F. antenna 49. A separate V. H. F. antenna 50 is shown connected to V. H. F. antenna terminals 51 and 52. A pair of coils 53 and 54 constitute primary windings of balancing and impedance matching transformers 55 and 56 which also have secondary windings 57 and 58. One end of the winding 57 is grounded and the other end is connected directly to the V. H. F. input terminal 28 of the tuner 1*a*. In the case of the secondary winding 58 one end is likewise grounded. A balancing capacitor 59 is connected between the other end of the winding 58 and ground. A coil 60 and an adjustable capacitor 61 are connected in series between each of the terminals 51 and 52 and ground to serve as an adjustable series resonant wave trap.

The superheterodyne converter 36 includes a mixer stage 62 which embodies the tuner 1*b*. Energy is transferred from the radio frequency amplifier stage 37 to the tuner 1*b* by means of an additional tuner 63 of a type disclosed and claimed in the copending application of Francis G. Mason, Serial No. 438,046, filed June 21, 1954, to which reference may be had for a complete description. Briefly, the tuner 63 comprises an elongated coil 64 disposed axially in an elongated tubular housing 65. One end of the coil 64 may be connected to the anode 41 of the radio frequency amplifier tube 38. The other end of the coil may be connected through a resistor 66 to a terminal 67 representing a source of positive anode supply voltage. To vary the resonant frequency of the tuner a "plunger" 68 is mounted in the housing 65. This plunger 68 comprises a pair of coaxial cylindrical elements 69 and 70 connected together by means of a web 71 or other conductive member. The cylindrical element 69 is disposed around and in closely spaced relation to the coil 64 and accordingly is in capacitive energy transfer relation to the coil. The cylindrical element 70 is closely adjacent the inside of the housing 68 and thus is capacitively coupled to the housing.

It will be apparent that the plunger 68 effectively grounds the portion of the coil 64 within the sleeve 69 so that only the portion of the coil 64 between the sleeve 69 and the anode 41 is effectively in the output circuit of the amplifier tube 38, the remaining portion of the coil 64 below the sleeve 69 being rendered inactive and being decoupled by the plunger from the active portion. Accordingly, moving the plunger in the housing 65 toward the end of the coil 64 connected to the amplifier tube 38 progressively decreases the effective inductance of the coil and thereby increases the resonant frequency of the tuner 63. It has been found that the tuner 63 provides high resonant impedance throughout its tuning range and, hence, insures the maintenance of high amplification in the amplifier tube 38.

To transfer energy from the tuner 63 at ultra high frequencies, an output coupling loop 72 is provided in the tuner housing 65 adjacent the coil 64. This coupling loop 72 is connected to the input coupling loop 29*b* of the tuner 1*b*. To transfer energy to the tuner 1*b* in the lower frequency portion of the tuning range covered by the converter 36, an adjustable coupling capacitor 73 is connected between the anode 41 of the raido frequency amplifier tube 38 and the V. H. F. input terminal 28*b* of the tuner 1*b*. In this instance, an aperiodic choke 74 is connected in series with the lead 35*b*, extending between the terminal 28*b* and the U. H. F. output coupling loop 32*b*, to prevent the capacitor 34*b* from effectively grounding the anode 41 at ultrahigh frequencies.

A crystal rectifier 75 is connected between the output terminal 33*b* of the tuner 1*b* and a terminal 76. Aperiodic chokes 77 and 78 are connected between the terminals 76 and ground, and between the lead 35*b* and ground, respectively, to provide a direct current return path for the rectifier 75. A high frequency filtering capacitor 79 is also connected between the terminal 76 and ground. The terminal 76 is connected to an intermediate frequency output terminal 80 by means of a series circuit comprising an inductor 81 and a capacitor 82.

The superheterodyne converter 36 is provided with a high frequency oscillator 83 which may be of any known or desired construction. For example, the oscillator may be constructed as disclosed in the copending application of Harold T. Lyman, Serial No. 438,045, filed June 21, 1954, Patent No. 2,786,945, issued March 26, 1957, or in the copending application of Harold T. Lyman and Francis G. Mason, Serial No. 435,159, filed June 8, 1954, Patent No. 2,781,451, issued February 12, 1957. Output energy from the oscillator 83 may be transferred from the tuner 1*b* by means of a lead 84 connected to a conductive probe 85 extending into the housing 2*b* of the tuner through an aperture 86.

As the oscillator 83 and the tuners 1*a*, 1*b*, and 63 are tuned in common between the lower and the upper ends of the frequency range of the converter 36, an automatic changeover is made between the V. H. F. and U. H. F. antennas 50 and 49. In the V. H. F. range, the sleeve 10 of the tuner 1*a* is within the ring 16 and, hence, is capacitively coupled to the V. H. F. antenna transformer 55. The coupling loop 29 is so small as to be ineffective or at least inefficient in the V. H. F. range. Hence, the U. H. F. antenna 49 may remain connected to the loop 29. In the U. H. F. range, on the other hand, the sleeve 10 is withdrawn inwardly from the ring 16 and the ring is effectively grounded by the capacitor 34. Accordingly, the V. H. F. antenna may remain connected to the ring 16. A similar changeover takes place in the input and output circuits for the tuner 1*b*.

The tuners 1*a* and 1*b* act as cavity resonators in the U. H. F. range and, hence, provide extremely high Q. This is very advantageous in the radio frequency amplifier circuits since it affords improvde selectivity. In this way the converter is better equipped to reject signals at or near the image frequency.

Various modifications, alternative constructions, and equivalents may be employed without departing from the true spirit and scope of the invention as set forth in the drawings and the foregoing description, and as defined in the following claims.

We claim:

1. In a wide range radio frequency tuner, the combination comprising a conductive housing for resonating as a cavity, said housing having first and second opposite end walls, a conductive post having one end connected to said first end wall and extending therefrom part way toward said second end wall, a coil having one end connected to said post and extending therefrom in alinement therewith toward said second end wall, a conductive tuning sleeve movable telescopically over said post and said coil, said sleeve enveloping said coil and at least a portion of said post with said sleeve in a first position, said sleeve in said first position being in closely adjacent energy-exchange relation to said post and effectively constituting an adjustable extension thereof, said sleeve being movable along said post toward said second end wall to a second position and thereby being effective to lengthen said post and progressively decrease the resonant frequency of said tuner with said housing effectively constituting a cavity resonator, a generally annular capacitive tuning electrode connected to said second end wall and alined with said sleeve, said sleeve having an enlarged portion received in said electrode in capacitive energy-exchange relation thereto with said sleeve at said second position, said sleeve extending between said post and said electrode at said second position, said sleeve progressively entering said electrode and thereby increasing the capacitance therebetween in the course of movement of said sleeve between said first and second positions, said sleeve and said electrode thereby cooperating to reduce the resonant frequency of said tuner as a cavity resonator, said sleeve being movable beyond said second position to a third position with a portion of said coil uncovered by said sleeve, said sleeve progressively uncovering said coil in the course of movement of said sleeve between said second and third positions, said sleeve thereby progressively introducing the inductance of said coil into said tuner and thereby further reducing the resonant frequency thereof, and a generally annular coupling electrode disposed along the path traversed by said enlarged portion of said sleeve in moving between said second and third positions for exchanging energy with said sleeve and thence with said coil.

2. In a wide range radio frequency tuner, the combination comprising a conductive housing for resonating as a cavity, said housing having first and second opposite end walls, a conductive post having one end in energy-exchange relation with said first end wall and extending from said first end wall part way toward said second end wall, a coil having one end connected to said post and extending therefrom in alinement therewith toward said second end wall, a conductive tuning sleeve movable telescopically over said post and said coil, said sleeve ennveloping said coil and at least a portion of said post with said sleeve in a first position, said sleeve in said first position being in closely adjacent energy-exchange relation to said post and effectively constituting an adjustable extension thereof, said sleeve being movable along said post toward said second end wall to a second position and thereby being effective to lengthen said post and progressively decrease the resonant frequency of said tuner with said housing effectively constituting a cavity resonator, a generally annular capacitive tuning electrode in energy-exchange relation with said second end wall and alined with said sleeve, said sleeve having a portion received in said electrode in energy-exchange relation thereto with said sleeve at said second position, said sleeve extending between said post and said electrode at said second position, said sleeve progressively entering said electrode and thereby increasing the capacitance therebetween in the course of movement of said sleeve between said first and second positions, said sleeve and said electrode thereby cooperating to reduce the resonant frequency of said tuner as a cavity resonator, said sleeve being movable beyond said second position to a third position with a portion of said coil uncovered by said sleeve, said sleeve progressively uncovering said coil in the course of movement of said sleeve between said second and third positions, said sleeve thereby progressively introducing the inductance of said coil into said tuner and further reducing the resonant frequency thereof, and a coupling electrode disposed along at least a portion of the path traversed by said sleeve in moving between said second and third positions for exchanging energy with said sleeve and thence with said coil.

3. In a wide range radio frequency tuner, the combination comprising a conductive housing for resonating as a cavity, said housing having first and second end walls, a conductive post having one end in energy-exchange relation with said first end wall and extending from said first end wall toward said second end wall, a coil having one end connected to said post and extending therefrom in alinement therewith toward said second end wall, a conductive tuning sleeve movable telescopically over said post and said coil, said sleeve enveloping said coil and at least a portion of said post with said sleeve in a first position, said sleeve in said first position being in energy-exchange relation to said post and effectively constituting an adjustable extension thereof, said sleeve being movable along said post toward said second end wall to a second position and thereby being effective to lengthen said post and progressively decrease the resonant frequency of said tuner, a capacitive tuning electrode in energy-exchange relation with said second end wall and alined with said sleeve, said sleeve having a portion adjacent said electrode in energy-exchange relation thereto with said sleeve at said second position, said sleeve extending between said post and said electrode at said second position, said sleeve progressively overlapping said electrode and thereby increasing the capacitance therebetween in the course of movement of said sleeve between said first and second positions, said sleeve and said electrode thereby cooperating to reduce the resonant frequency of said tuner, said sleeve being movable beyond said second position to a third position with a portion of said coil uncovered by said sleeve, said sleeve progressively uncovering said coil in the course of movement of said sleeve between said second and third positions, said sleeve thereby progressively introducing the inductance of said coil into said tuner and further reducing the resonant frequency thereof, and a coupling electrode disposed along the path traversed by said sleeve for exchanging energy therewith.

4. In a wide range radio frequency tuner, the combination comprising a conductive housing for resonating as a cavity, said housing having first and second end walls, a conductive post having one end in energy-exchange relation with said first end wall and extending from said first end wall toward said second end wall, a coil having one end connected to said post and extending therefrom in alinement therewith toward said second end wall, a conductive tuning sleeve movable telescopically over said post and said coil, said sleeve enveloping said coil and at least a portion of said post with said sleeve in a first position, said sleeve in said first position being in energy-exchange relation to said post and effectively constituting an adjustable extension thereof, said sleeve being movable along said post toward said second end wall to a second position and thereby being effective to lengthen said post and progressively decrease the resonant frequency of said tuner, a capacitive tuning electrode in energy-exchange relation with said second end wall and alined with said sleeve, said sleeve having a portion adjacent said electrode in energy-exchange relation thereto with said sleeve at said second position, said sleeve extending between said post and said electrode at said second position, said sleeve progressively overlapping said electrode and thereby increasing the capacitance therebetween in the course of movement of said sleeve between said first and second positions, said sleeve and said electrode thereby cooperating to reduce the resonant frequency of said tuner, said sleeve being movable beyond said second position to a third position with a portion of said coil uncovered by said sleeve, said sleeve progressively uncovering said coil in the course of movement of said sleeve between said second and third positions, said sleeve thereby progressively introducing the inductance of said coil into said tuner and further reducing the resonant frequency thereof.

5. In a wide range radio frequency tuner, the combination comprising a conductive housing for resonating as a cavity, said housing having first and second opposite end walls, a conductive post having one end connected to said first end wall and extending therefrom part way toward said second end wall, a coil having one end connected to said post and extending therefrom in alinement therewith toward said second end wall, a conductive tuning sleeve movable telescopically over said post and said coil, said sleeve enveloping said coil and at least a portion of said post with said sleeve in a first position, said sleeve in said first position being in closely adjacent energy-exchange relation to said post and effectively constituting an adjustable extension thereof, said sleeve being movable along said post toward said second end wall to a second position and thereby being effective to lengthen said post and progressively decrease the resonant frequency of said tuner with said housing effectively constituting a cavity resonator, a generally annular capacitive tuning electrode connected to said second end wall and alined with said sleeve, said sleeve having an enlarged portion received in said electrode in capacitive energy-exchange relation thereto with said sleeve at said second position, said sleeve extending between said post and said electrode at said second position, said sleeve progressively entering said electrode and thereby increasing the capacitance therebetween in the course of movement of said sleeve between said first and second positions, said sleeve and said electrode thereby cooperating to reduce the resonant frequency of said tuner as a cavity resonator, said sleeve being movable beyond said second position to a third position with a portion of said coil uncovered by said sleeve, said sleeve progressively uncovering said coil in the course of movement of said sleeve between said second and third positions, said sleeve thereby progressively introducing the inductance of said coil into said tuner and thereby further reducing the resonant frequency thereof, first and second coupling loops in said housing, one of said loops constituting an input loop and the other constituting an output loop at relatively high frequencies, said coupling electrode constituting a low frequency circuit terminal of said tuner, one end of said first loop constituting another circuit terminal, a lead connecting the other end of said first loop to said coupling electrode, and capacitor means connected between said coupling electrode and said housing for inactivating said coupling electrode at relatively high frequencies.

6. In a wide range radio frequency tuner, the combination comprising a conductive housing for resonating as a cavity, said housing having first and second end walls, a conductive post having one end in energy-exchange relation with said first end wall and extending from said first end wall toward said second end wall, a coil having one end connected to said post and extending therefrom toward said second end wall, a conductive tuning sleeve movable telescopically over said post and said coil, said sleeve enveloping said coil and at least a portion of said post with said sleeve in a first position, said sleeve in said first position being in energy-exchange relation to said post and effectively constituting an adjustable extension thereof, said sleeve being movable along said post toward said second end wall to a second position and thereby being effective to lengthen said post and progressively decrease the resonant frequency of said tuner, a capacitive tuning electrode in energy-exchange relation with said second end wall and alined with said sleeve, said sleeve having a portion adjacent said electrode in energy-exchange relation thereto with said sleeve at said second position, said sleeve extending between said post and said electrode at said second position, said sleeve progressively overlapping said electrode and thereby increasing the capacitance therebetween in the course of movement of said sleeve between said first and second positions, said sleeve and said electrode thereby cooperating to reduce the resonant frequency of said tuner, said sleeve being movable beyond said second position to a third position with a portion of said coil uncovered by said sleeve, said sleeve progressively uncovering said coil in the course of movement of said sleeve between said second and third positions, said sleeve thereby progressively introducing the inductance of said coil into said tuner and further reducing the resonant frequency thereof, said coupling electrode constituting a first circuit terminal of said tuner, a second circuit terminal, a coupling loop disposed in said housing and having its ends connected to said respective terminals, and capacitor means connected between said coupling electrode and said housing to inactivate said coupling electrode at high frequencies.

References Cited in the file of this patent

UNITED STATES PATENTS

| | | |
|---|---|---|
| 2,247,212 | Trevor | June 24, 1941 |
| 2,402,443 | Peterson | June 18, 1946 |
| 2,414,280 | Thomas | Jan. 14, 1947 |
| 2,465,102 | Joy | Mar. 22, 1949 |
| 2,688,891 | Wen Yuan Pan | Sept. 7, 1954 |
| 2,774,044 | Silvey | Dec. 11, 1956 |

UNITED STATES PATENT OFFICE
CERTIFICATE OF CORRECTION

Patent No. 2,850,632 September 2, 1958

Harold T. Lyman et al

It is hereby certified that error appears in the printed specification of the above numbered patent requiring correction and that the said Letters Patent should read as corrected below.

Column 1, before the paragraph beginning with the words "One principal object" in line 15, insert the following opening paragraph—

> This invention relates to radio frequency tuners, particularly those adapted to cover extremely wide frequency ranges at very high and ultrahigh frequencies.

column 4, line 73, after "1b" insert -- , the tuner 1a --; column 5, line 73, for "raido" read -- radio --.

Signed and sealed this 11th day of November 1958.

(SEAL)

Attest:

KARL H. AXLINE

Attesting Officer

ROBERT C. WATSON

Commissioner of Patents